United States Patent [19]

Umezu et al.

[11] Patent Number: 5,305,187
[45] Date of Patent: Apr. 19, 1994

[54] BUILDING BOX TYPE PLUG-IN MODULAR RACK STRUCTURE FOR ELECTRONIC EQUIPMENT

[75] Inventors: Mitsuhiro Umezu; Kazuo Ikeda, both of Tokyo, Japan

[73] Assignee: NEC Corporation, Tokyo, Japan

[21] Appl. No.: 47,704

[22] Filed: Apr. 14, 1993

[30] Foreign Application Priority Data

Apr. 15, 1992 [JP] Japan ................... 4-095125

[51] Int. Cl.⁵ .................. H05K 1/14; H02B 1/01
[52] U.S. Cl. .................. 361/784; 361/796; 361/829; 257/686
[58] Field of Search ........... 361/748, 752, 784, 792, 361/796, 807, 829; 211/41; 312/111; 257/685, 686

[56] References Cited

U.S. PATENT DOCUMENTS 3,602,774  8/1971  Grant ................. 361/415
3,772,572  11/1973  Marquette ............. 361/415

Primary Examiner—Leo P. Picard
Assistant Examiner—Bot Lee Ledynh
Attorney, Agent, or Firm—Laff, Whitesel, Conte & Saret

[57] ABSTRACT

In a building box type plug-in modular rack structure for electronic equipment, a box-like shelf accommodates a plurality of printed circuit boards therein. A pair of side frames symmetrical in a right-and-left direction each has a recess at the upper end and a projection at the lower end for respectively mating with the projection and the recess of adjoining side frames. A framework is constituted by the pair of side frames and the shelf interposed between them. Covers cover the outer periphery of the framework. A plurality of frameworks are stacked and connected together by the recesses and the projections of the side frames. A top cover and a bottom cover respectively are fitted on the top and the bottom of the stack of frameworks.

3 Claims, 7 Drawing Sheets

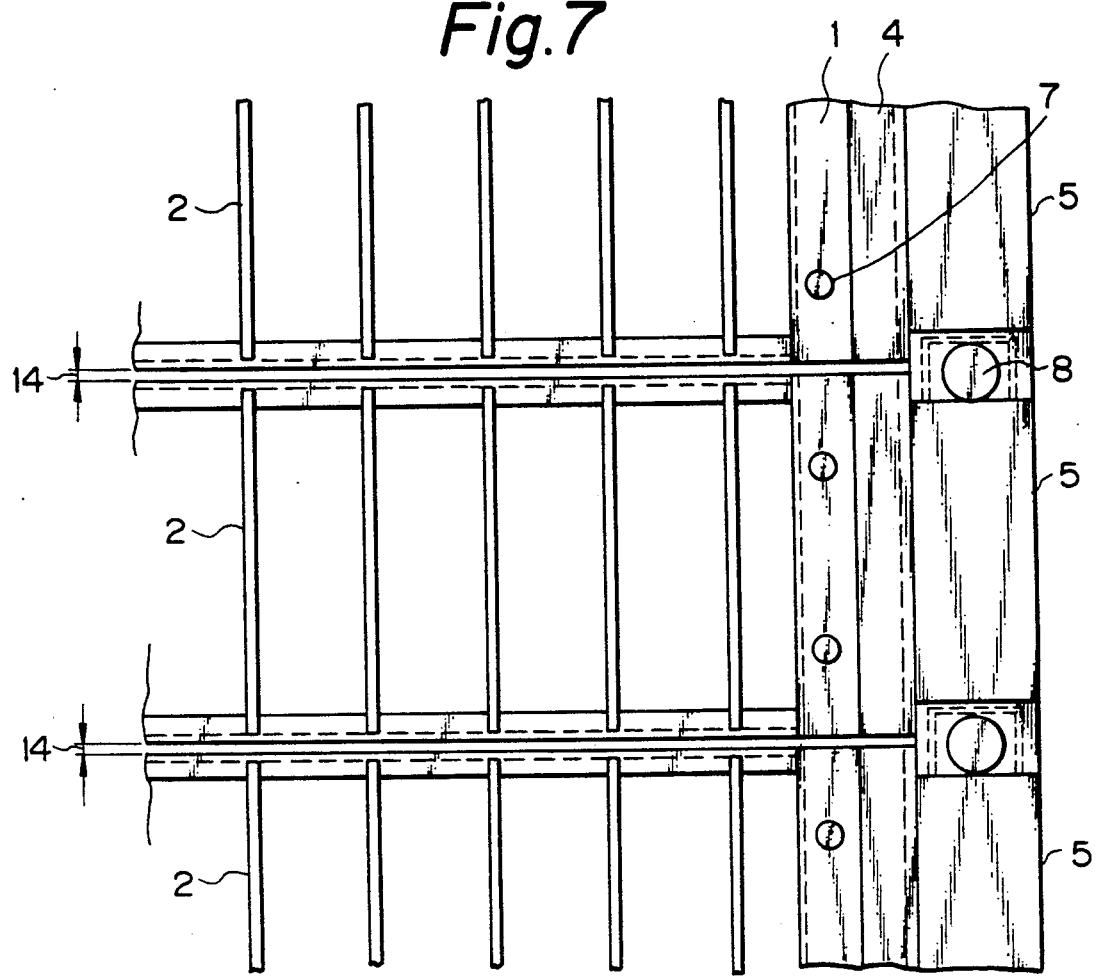
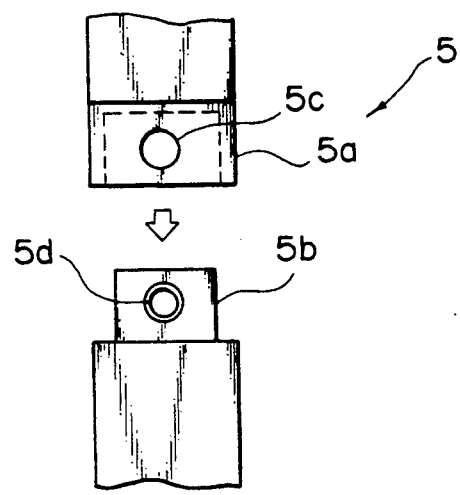

BUILDING BOX TYPE PLUG-IN MODULAR RACK STRUCTURE FOR ELECTRONIC EQUIPMENT

BACKGROUND OF THE INVENTION

The present invention relates to the assembly of boxes loaded with printed circuit boards for electronic equipment and, more particularly, to a building box type plug-in modular rack structure for electronic equipment.

It is a common practice to provide an electronic exchange or similar electronic communication equipment with a rack structure made up of electronic units and a rack accommodating the electronic units. The electronic units are each constituted by a plurality of printed circuit boards on which various electronic parts are packaged, and a shelf or subrack accommodating the circuit boards. Alternatively, the shelf loaded with printed circuit boards may itself be configured as a single framework, and a plurality of such frameworks may be stacked one upon the other. Such conventional rack structures are disclosed in, for example, Japanese Patent Laid-Open Publication No. 211295/1982.

However, a problem with the first-mentioned conventional rack scheme is that since the electronic units each has a box-like configuration, they increase the number of parts when received in the rack having a predetermined size. Moreover, regarding communication equipment, the number of electronic units to be accommodated in a single rack increases or decreases depending on the number of terminal units to be connected to the equipment and the processing ability of such terminal units. Hence, when the number of terminal units is small or their processing ability is low, only a small number of electronic units are mounted on a single rack, wasting much of the space available in the rack. In addition, when the communication equipment is packaged and transported, the rack having substantial dimensions is the minimum unit of packaging and transport even when the number of electronic units accommodated therein is small. This is undesirable from the cost standpoint.

Even the second-mentioned rack scheme is not fully satisfactory for the following reasons. Assume that the communication equipment is scaled up and brought into operation. Then, it is extremely difficult to replace desired one of the electronic units mounted on the stacked frameworks. This is especially true when the desired electronic unit is received in any of the frameworks underlying the uppermost framework and when the electronic units are connected by, for example, cables. Furthermore, upper and lower portions of each framework have to be mechanically strong enough to sustain a plurality of shelves and, therefore, need a substantial dimension. It follows that when the frameworks are sequentially stacked, the overall rack has the dimensions thereof increased, mainly in the direction of height. This is contradictory to the increasing demand for miniature communication equipment.

SUMMARY OF THE INVENTION

It is, therefore, an object of the present invention to provide a building box type modular rack structure for communication equipment which allows any desired electronic unit to be easily removed therefrom even after the equipment has been scaled up and brought into operation.

It is another object of the present invention to provide a building box type plug-in modular rack structure for communication equipment which has a minimum necessary space and can be increased or reduced in size to implement a particular processing ability.

It is another object of the present invention to provide a building box type plug-in modular rack structure whose overall size can be reduced to miniaturize communication equipment to which it is applied.

It is another object of the present invention to provide a building box type plug-in modular rack structure for communication equipment which can be packaged and transported at low cost.

A building box type plug-in modular rack structure for electronic equipment of the present invention has a box-like shelf accommodating a plurality of printed circuit boards therein, a pair of side frames symmetrical in a right-and-left direction each and each having a recess at the upper end and a projection at the lower end for respectively mating with the projection and the recess of adjoining side frames, a framework constituted by the pair of side frames and the shelf interposed between them, and covers covering the outer periphery of the framework. A plurality of frameworks are stacked and connected together by the recesses and the projections of the side frames. A top cover and a bottom cover respectively are fitted on the top and the bottom of the stack of frameworks.

BRIEF DESCRIPTION OF THE DRAWINGS

The above and other objects, features and advantages of the present invention will become more apparent from the following detailed description taken with the accompanying drawings in which:

FIGS. 5-7 are enlarged views showing various portions of the embodiment in detail; and FIG. 8 is an enlarged front view showing part of the rack structure of FIG. 4.

DESCRIPTION OF THE PREFERRED EMBODIMENT

Figure 1:
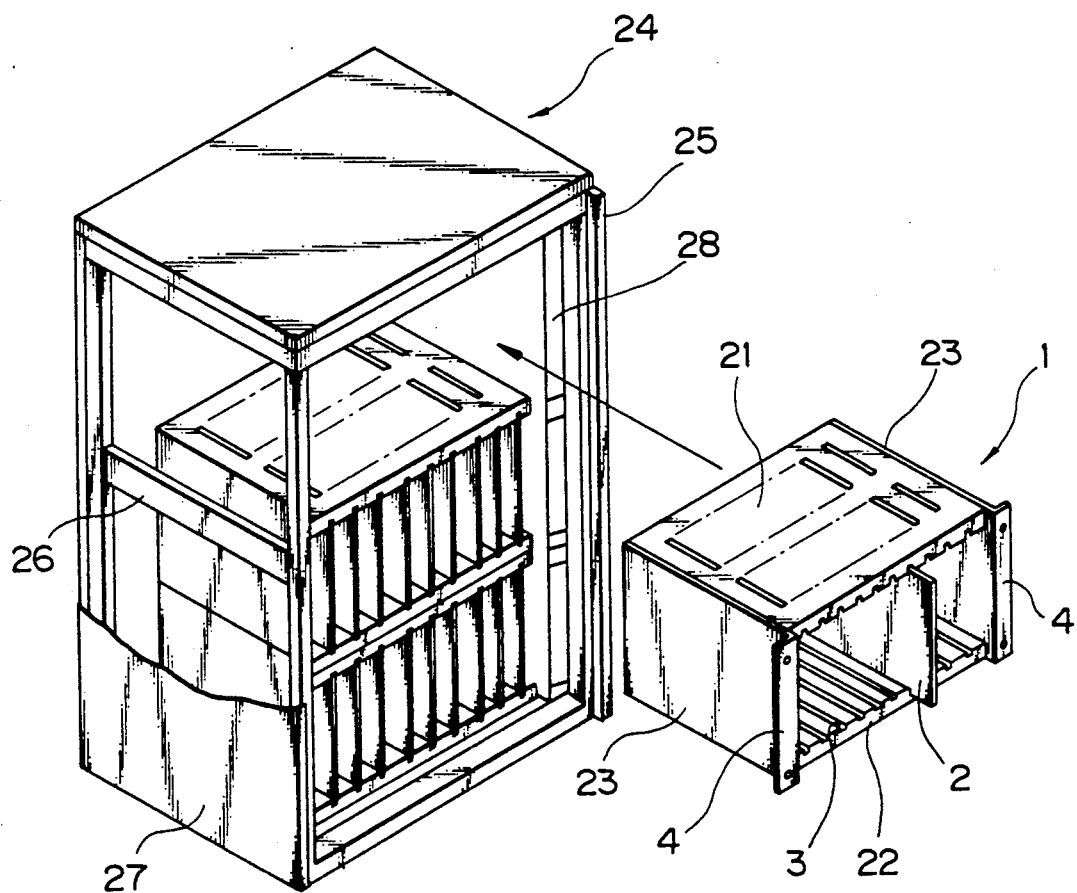
FIG. 1 is a perspective view of a conventional rack structure.

To better understand the present invention, a brief reference will be made to a conventional rack structure for communication equipment, shown in FIG. 1. As shown, the rack, generally 24, is implemented as a box having posts 25, tie bars 26 connecting the posts 25, and metallic panels 27 constituting the walls of the rack. Extra posts 28 are mounted on the front posts 25 for affixing shelves 1. Each shelf 1 is also implemented as a box having guide channels 3 for inserting printed circuit boards 2, a top wall 21, a bottom wall 22, and opposite side walls 23 each being provided with a flange 4 to be affixed to the rack 24. Each shelf 1 is loaded with the printed circuit boards 2, inserted into the rack 24, and then has the flanges 4 thereof affixed to the posts 28 of the rack 24.

The conventional rack 24 described above has some problems left unsolved, as discussed earlier. Specifically, since the electronic units each has a box-like configuration, they increase the number of parts when accommodated in the rack 24 having a predetermined size. Moreover, regarding communication equipment, the number of electronic units to be accommodated in a single rack 24 increases or decreases depending on the number of terminal units to be connected to the equipment and the processing ability of such terminal units. Hence, when the number of terminal units is small or their processing ability is low, only a small number of electronic units are mounted on a single rack 24, wasting much of the space available in the rack 24. In addition, when the communication equipment is packaged and transported, the rack 24 having substantial dimensions is the minimum unit of packaging and transport even when the number of electronic units accommodated therein is small. This is undesirable from the cost standpoint.

Figure 2:
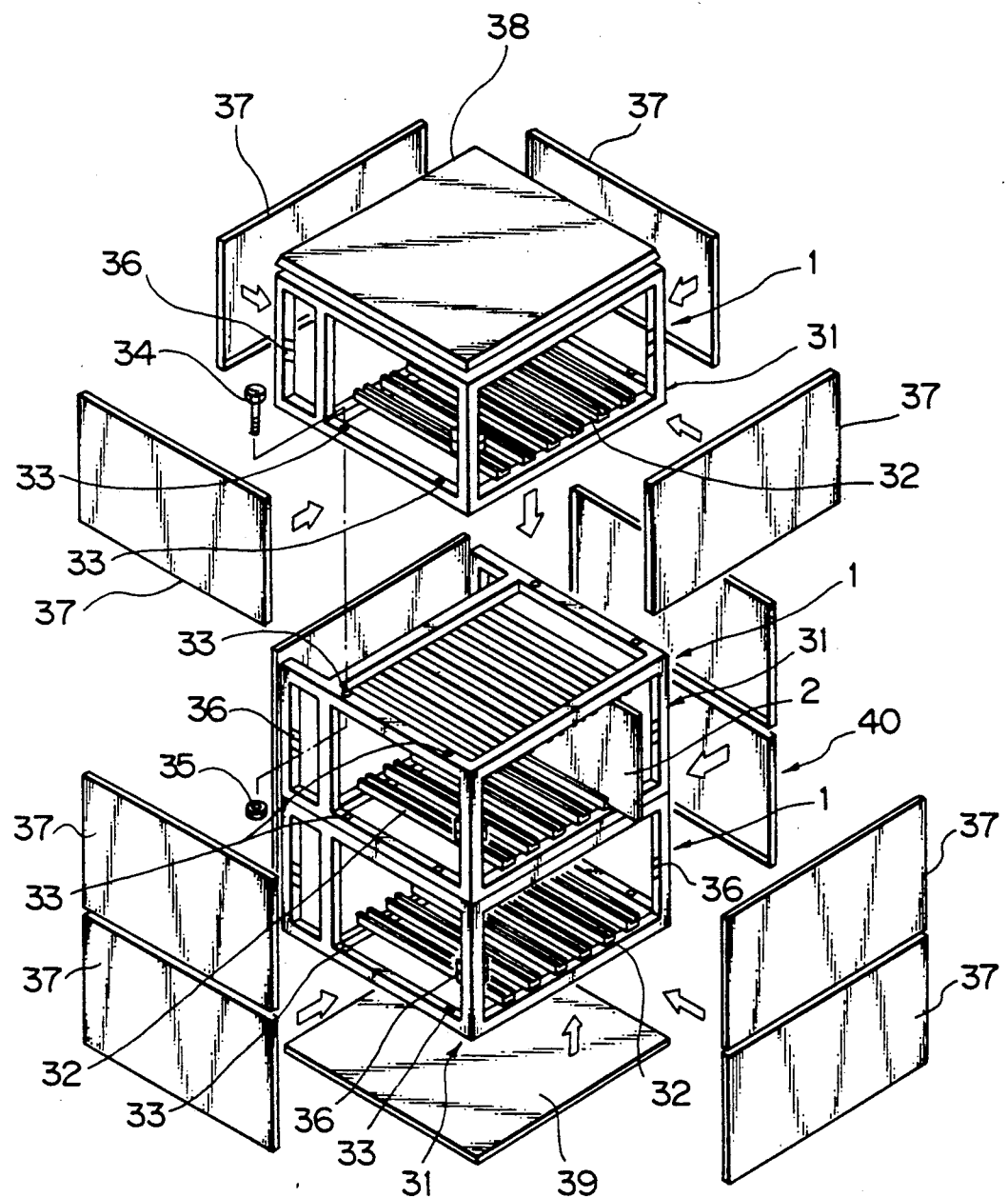
FIG. 2 is an exploded perspective view of another conventional rack structure.
Figure 3:
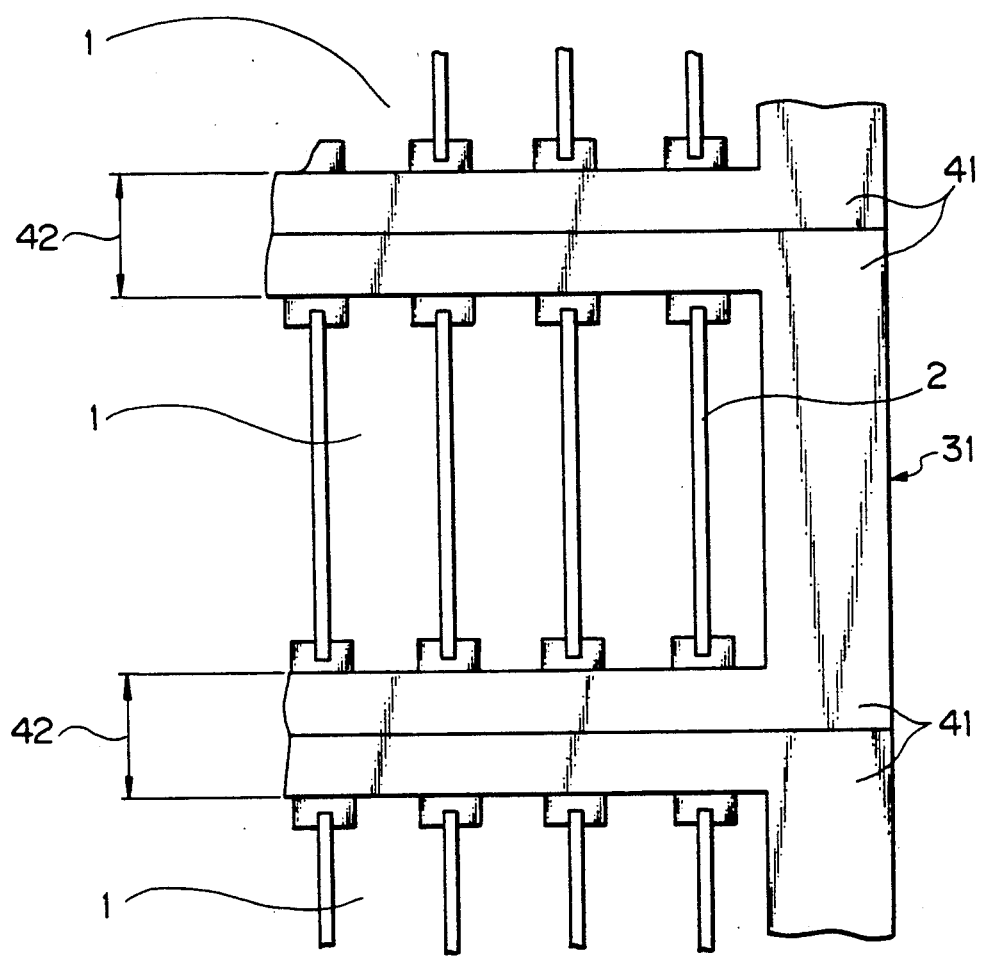
FIG. 3 is a fragmentary enlarged view of the rack structure shown in FIG. 2.
Figure 4:
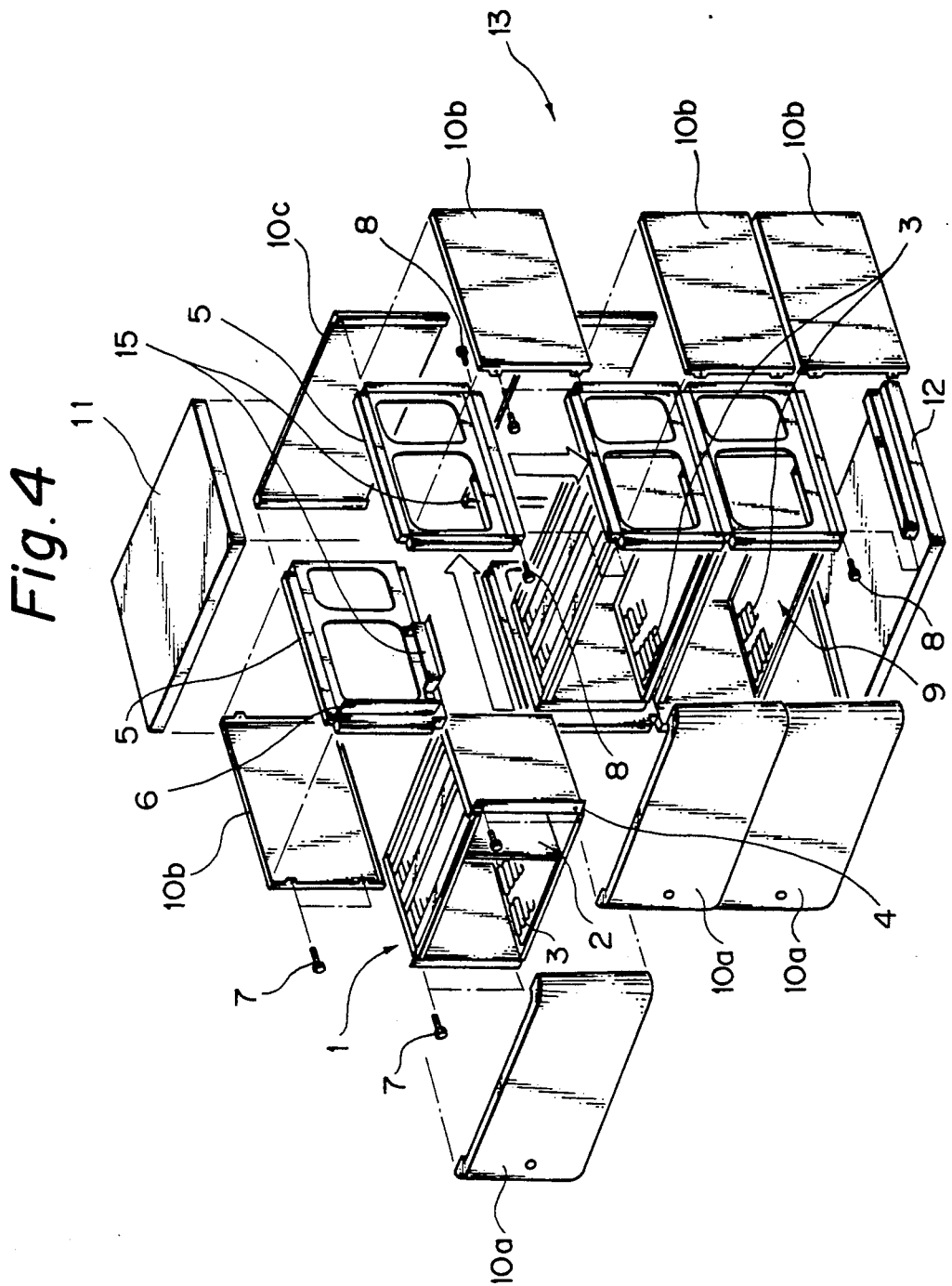
FIG. 4 is an exploded perspective view of a building box type plug-in modular rack structure embodying the present invention.
Figure 5:
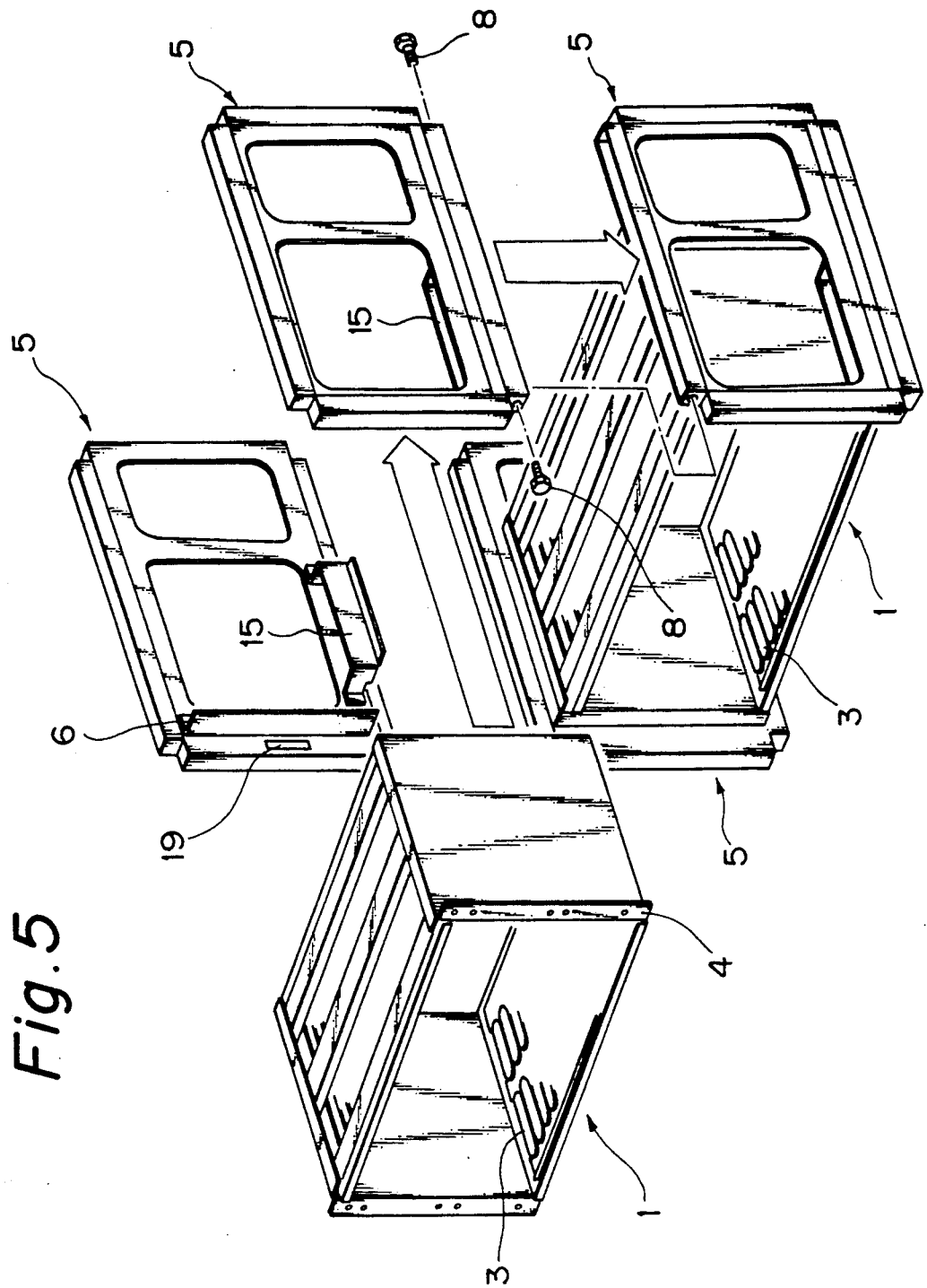
Figure 6:
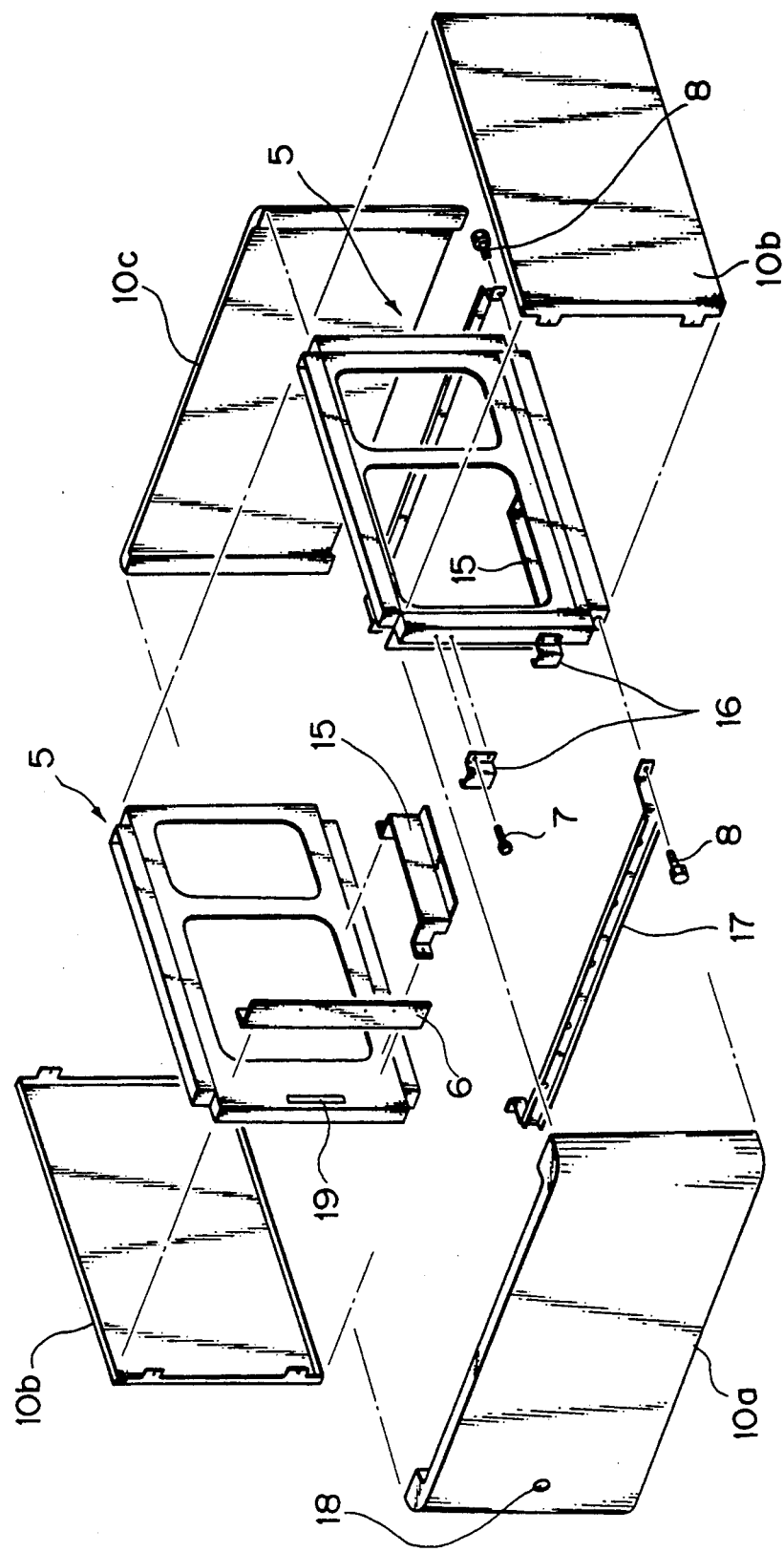

FIGS. 2 and 3 show another conventional rack structure in which the shelves 1 themselves are each configured as a rectangular parallelpiped framework 31. A plurality of guide bars 32 are affixed to each of the top and the bottom of the framework 31 and positioned face to face for guiding the printed circuit boards 2 into the shelf 1. Although the guide bars 32 are shown as being implemented as independent members, they may be joined together in the same manner as the guide channels 3, FIG. 1. Holes 33 are formed through each framework 31. After two shelves 1 have been stacked one upon the other, bolts 34 are inserted into the holes 33 of the shelves 1 and then held by nuts 35 to fasten the shelves 1 to each other. Lugs 36 each having a hole are formed on the periphery of each framework 31. Side panels 37, a top panel 38 and a bottom panel 39 are fastened to the lugs 36 by screws or have complementary lugs thereof mated with the lugs 36, thereby completing a rack 40. While the side panels 37 are each shown as matching a single shelf or unit shelf 1 in size, side panels of various dimensions may be prepared and selectively used in association with the height of the stack of the shelves 1.

Even this rack structure proposed in the past is not fully satisfactory, as also discussed previously. Specifically, assume that the communication equipment is scaled up and brought into operation. Then, it is extremely difficult to replace desired one of the electronic units mounted on the stacked frameworks 31. This is especially true when the desired electronic unit is received in any of the frameworks 31 underlying the top framework 31 and when the electronic units are connected by, for example, cables. Furthermore, as shown in FIG. 3, upper and lower portions 41 of each framework 31 have to be mechanically strong enough to sustain a plurality of shelves 1 and, therefore, need a substantial dimension 42. It follows that when the frameworks 31 are sequentially stacked, the overall rack 40 has the dimensions thereof increased, mainly in the direction of height. This is contradictory to the increasing demand for miniature communication equipment.

Referring to FIGS. 4-8, a building box type plug-in modular rack structure embodying the present invention will be described which is free from the above-stated drawbacks. As shown, each shelf 1 has a box-like configuration for accommodating a plurality of printed circuit boards 2 along guide channels 3 thereof. As shown in FIG. 8, a pair of side frames 5 which are symmetrical in the right-and-left direction are each provided with a recess 5a at the lower end and a projection 5b at the upper end. The pair of side frames 5 are each formed with a post 6. The shelf 1 is interposed between the right and left side frames 5 and fastened at flanges 4 thereof to the posts 6 by screws 7. Guide rails 15 are affixed to the side frames 5 to guide the shelf 1 to between the side frames 5. As a result, the shelf 1 and associated side frames 5 constitute a framework 9 in combination. Covers 10a-10c are affixed to the outer periphery of the framework 9. Among the covers 10a-10c, the front cover 10a is hinged to the framework 9 by hinges 16 mounted on either of the right and left side frames 5 and a cover bracket 17. In this configuration, the front cover 10a is movable, i.e., openable away from the framework 9 like a door. Further, a key 18 is provided in the front cover 10a while a rectangular hole 19 matching the key 18 is formed in the side frame 5.

The frameworks 9 having an identical configuration are stacked one upon the other with their recesses 5a and projections 5b mated together. Subsequently, bolts 8 are inserted into aligned ones of holes 5c and tap holes 5d, FIG. 8, associated with the recessed 5a and the projections 5b, respectively. In this manner, a desired number of frameworks 9 are stacked one upon the other and fastened together. A box-like top cover 11 is formed with recesses similar to the recesses 5a of the side frames 5 and fitted on the top of the uppermost framework 9 or to the top of a single framework 9. A box-like bottom cover 12 is formed with projections similar to the projections 5b of the side frames 5 and fitted on the bottom of the lowermost framework 9 or the bottom of a single framework 9.

A rack, generally 13, having the above structure allows any one of the shelves 1 to be readily removed therefrom or inserted thereinto even after the shelves 1 have been stacked and fastened. The side frames 5, top cover 11 and bottom cover 12 are firmly connected together by bolts 8 or similar fasteners to insure mechanical strength. Consequently, as shown in FIG. 7, the adjoining shelves 1 are spaced apart by only a small clearance 14.

In summary, it will be seen that the present invention provides a rack structure which implements communication equipment with a minimum necessary space and a minimum number of parts. The rack structure, therefore, allows the communication equipment to be scaled up just to a size matching the processing ability and promotes efficient packaging and transport of the equipment in respect of cost. Moreover, the rack structure allows, despite the dense arrangement thereof, any desired functions to be replaced with ease even after the equipment has been brought into operation.

Various modifications will become possible for those skilled in the art after receiving the teachings of the present disclosure without departing from the scope thereof.

What is claimed is:
1. A building box type plug-in modular rack structure comprising:
 a box-like shelf for accommodating a plurality of printed circuit boards therein;
 a pair of side frames symmetrical in a right-and-left direction and each having a recess at an upper end and a projection at a lower end for respectively mating with a projection and a recess of adjoining side frames;
 a framework consisting of said pair of side frames and said shelf interposed between said pair of side frames; and
 covers covering outer periphery of said framework;

wherein a plurality of said frameworks are stacked and connected together by said recesses and said projections of said side frames, a top cover and a bottom cover respectively being fitted on the top and the bottom of the stack of said plurality of frameworks.

2. A rack structure as claimed in claim 1, wherein said side frames mated with each other by said recesses and said projections in an up-and-down direction are fastened by fastening members.

3. A rack structure as claimed in claim 1, wherein any one of said plurality of frameworks stacked one upon the other is freely removable.

* * * * *